(12) United States Patent
Higashiyama

(10) Patent No.: US 6,877,648 B2
(45) Date of Patent: Apr. 12, 2005

(54) ULTRASONIC HORN, AND ULTRASONIC BONDING APPARATUS USING THE ULTRASONIC HORN

(75) Inventor: Yuzo Higashiyama, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 115 days.

(21) Appl. No.: 10/372,372

(22) Filed: Feb. 24, 2003

(65) Prior Publication Data

US 2003/0160084 A1 Aug. 28, 2003

(30) Foreign Application Priority Data

Feb. 25, 2002 (JP) ........................................ 2002-047480
Jan. 31, 2003 (JP) ........................................ 2003-024479

(51) Int. Cl.⁷ .............................. B23K 1/06; B32B 31/00
(52) U.S. Cl. .................. 228/1.1; 228/110.1; 156/580.1; 156/580.2
(58) Field of Search ........................ 228/1.1, 4.5, 110.1; 156/73.1, 73.2, 580.1, 580.2

(56) References Cited

U.S. PATENT DOCUMENTS

| | | | | |
|---|---|---|---|---|
| 5,645,681 A | * | 7/1997 | Gopalakrishna et al. | 156/580.2 |
| 6,078,125 A | * | 6/2000 | Roberts | 310/325 |
| 6,244,498 B1 | * | 6/2001 | Jiang et al. | 228/180.5 |
| 6,247,628 B1 | * | 6/2001 | Sato et al. | 228/1.1 |
| 6,743,331 B1 | * | 6/2004 | Takahashi et al. | 156/580.2 |
| 2003/0168938 A1 | * | 9/2003 | Wallaschek et al. | 310/328 |
| 2004/0041003 A1 | * | 3/2004 | Higashiyama | 228/110.1 |
| 2004/0112547 A1 | * | 6/2004 | Tamamoto | 156/580.1 |

FOREIGN PATENT DOCUMENTS

| | | | |
|---|---|---|---|
| DE | 2708226 A | * | 8/1978 |
| JP | 10-236439 A | * | 9/1998 |
| JP | 38291 | | 2/2001 |
| JP | 44242 | | 2/2001 |
| JP | 110850 | | 4/2001 |
| JP | 334907 | | 11/2002 |

* cited by examiner

Primary Examiner—Lynne R. Edmondson
(74) Attorney, Agent, or Firm—Ostrolenk, Faber, Gerb & Soffen, LLP

(57) ABSTRACT

An ultrasonic bonding apparatus including an ultrasonic horn formed as a horizontally symmetrical inverse triangle having two apexes besides a lower apex facing downwards; a vibrator attached to at least one apex for inputting ultrasonic vibrations in a direction facing the lower apex; and a load applying device linked to the ultrasonic horn above the lower apex and near the symmetry axis thereof, for applying a downwards pressing load. An abutting member for pressing on the objects to be bonded is provided at the lower apex of the horn. No flexing occurs at the ultrasonic horn due to the applied load, and a uniform load and ultrasonic vibrations are applied to the entire bonding face, yielding uniform and high-quality bonding.

11 Claims, 19 Drawing Sheets

DISPLACEMENT VECTOR DIAGRAM

FIG.5B  DISPLACEMENT CONTOUR DIAGRAM

DISPLACEMENT VECTOR DIAGRAM

DISPLACEMENT CONTOUR DIAGRAM

ULTRASONIC HORN, AND ULTRASONIC BONDING APPARATUS USING THE ULTRASONIC HORN

BACKGROUND OF THE INVENTION

1. Field of the Invention

The present invention relates to an ultrasonic horn for applying ultrasonic vibrations to multiple objects to be bonded so as to bond them, and to an ultrasonic bonding apparatus using the ultrasonic horn.

2. Description of the Related Art

The following description makes reference to a Patent Reference 1, Japanese Unexamined Patent Application Publication No. 2001-44242, and a Patent Reference 2, Japanese Unexamined Patent Application Publication No. 2001-110850.

Ultrasonic bonding apparatuses are used in the process of flip chip mounting of electronic parts, such as semiconductor devices and piezoelectric devices, on boards.

Patent Reference 1 discloses an ultrasonic bonding apparatus wherein a member to be bonded to a face is subjected to a pressing load and ultrasonic vibrations, so as to be bonded to the face. This ultrasonic bonding apparatus has a vibrator mounted on the tip of a pointed horn, for applying vertical vibrations, which are vibrations in the longitudinal direction of the horn, and a bonding tool positioned at the loop of standing waves of the vertical vibrations of the horn, approximately orthogonal to the direction of vertical vibrations from the horn. A connector with pressing means for applying a pressing load is provided at the approximate center of the horn.

Patent Reference 2 discloses an ultrasonic bonding apparatus wherein a generally T-shaped horn is turned sideways, a vibrator is attached to one end of the sidebar portion thereof, and the vertical bar is formed in a cylindrical shape through which a holding member is passed, and pressing means for applying the pressing load is connected to the tip of this holding member. In this case, the means for applying the pressing load (i.e., the holding member) and the means for applying ultrasonic waves (i.e., the horn) are configured as separate members, and have separate functions.

However, with the arrangement disclosed in Patent Reference 1, the bonding tool which is subjected to vertical vibrations of the horn flexes and vibrates, so the tip portion thereof swings like a pendulum, and ultrasonic vibrations cannot be applied to the bonding face in a constant direction. Accordingly, there are differences in vibration components between the center and edge portions of the bonding portion, resulting in irregularities in the bonding state depending on the part. Consequently, the bonding is not uniform, so bonding quality is poor, and there is also the problem that additional damage to the bonded members may result in cracking, splitting, chipping, and so forth.

On the other hand, with the arrangement disclosed in Patent Reference 2, the holding member for applying the pressing load to the bonding portion and the cylindrical portion of the horn for applying the ultrasonic vibrations are not completely separate but rather in contact, so vibrations are also applied to the holding member. Accordingly, the vibrations applied to the bonding portion have multiple modes, so vibrations suitable for bonding cannot be applied. Also, the tip of the T-shaped horn in contact with the bonding portion flexes and vibrates, so ultrasonic vibrations cannot be applied to the bonding face in a constant direction. This causes a problem of poor bonding quality at the bonding portion.

SUMMARY OF THE INVENTION

The present invention addresses these problems by providing an ultrasonic horn capable of applying ultrasonic vibrations in a constant direction to the bonding face, yielding uniform and high-quality bonding.

The invention also provides an ultrasonic bonding apparatus wherein flexing does not occur at the ultrasonic horn due to the applied load, thereby applying ultrasonic vibrations in a constant direction to the entire bonding face, yielding uniform and high-quality bonding.

According to a first aspect of the present invention, an ultrasonic horn for applying ultrasonic vibrations to bond an object to another object comprises: a main horn unit having left and right apexes and a lower apex, formed generally symmetrical horizontally; a vibration input portion provided at at least one of the left and right apexes of the main horn unit; and a vibration output portion provided at the lower apex of the main horn unit for providing ultrasonic vibrations to the object to be bonded; wherein, when ultrasonic vibrations are input to the vibration input portion in a direction generally toward the vibration output portion, ultrasonic vibrations generally perpendicular to the symmetry axis of the main horn unit are output from the vibration output portion.

Also, according to a second aspect of the present invention, an ultrasonic bonding apparatus for applying a pressing load and ultrasonic vibrations to bond an object to another object, comprises: an ultrasonic horn having left and right apexes and a lower apex, formed generally symmetrical horizontally, the horn comprising a vibration input portion provided at at least one of the left and right apexes, a vibration output portion provided at the lower apex, and a load application portion positioned above the lower apex of the main horn unit and near the symmetry axis thereof; a vibration input device attached to the vibration input portion of the ultrasonic horn, for inputting ultrasonic vibrations to the vibration input portion in a direction generally toward the vibration output portion; and a load applying device linked to the load application portion of the ultrasonic horn, for applying a downward pressing load to the ultrasonic horn; wherein the ultrasonic horn is positioned such that the vibration output portion applies a pressing load and ultrasonic vibrations to the object to be bonded; and wherein the load applying device is positioned such that the vector of the pressing load passes over or near the vibration output portion.

Further, according to a third aspect of the present invention, an ultrasonic bonding method for applying a pressing load and ultrasonic vibrations to bond an object to another object comprises the steps of: providing an ultrasonic horn having left and right apexes and a lower apex, formed generally symmetrical horizontally, the horn comprising a vibration input portion provided at at least one of the left and right apexes, a vibration output portion provided at the lower apex, and a load application portion positioned above the lower apex of the main horn unit and near the symmetry axis thereof; holding an object to be bonded at the vibration output portion of the ultrasonic horn; abutting the object to be bonded against an object to be bonded to; inputting ultrasonic vibrations to the vibration input portion of the ultrasonic horn in a direction generally toward the vibration output portion; and applying a downward pressing load to the load application portion of the ultrasonic horn;

wherein the vibration output portion of the ultrasonic horn applies a pressing load and ultrasonic vibrations to the object to be bonded, thereby bonding the object to the other object.

The ultrasonic horn according to the present invention is formed as a generally horizontally-symmetrical inverse triangle, having left and right apexes and a lower apex. Inputting ultrasonic vibrations to at least one of the apexes on the left or right in a direction generally facing this apex and the lower apex generates ultrasonic vibrations at the lower apex that are generally perpendicular to the symmetry axis of the main horn unit. That is to say, the ultrasonic vibrations which are input in a diagonal direction from one of the apexes on the left or right, are output from the lower apex as ultrasonic vibrations in a horizontal direction. The output ultrasonic vibrations are vibrations in a constant direction, unlike flexing vibrations, so there is no difference in vibration components between the center and edge portions of the bonding portion, and no irregularities in the bonding state according to the shape of the part. Consequently, the bonding is uniform, so bonding quality improves, there is no additional damage to the bonding portion, and cracking, splitting, chipping, and so forth, can be prevented.

The main horn unit may have a general inverted triangle shape. This arrangement allows ultrasonic vibrations with a greater amplitude than the ultrasonic vibrations input to the vibration input portion to be output from the vibration output portion, thereby yielding a ultrasonic horn with excellent vibration efficiency.

The ultrasonic horn preferably further comprises a load application portion for applying a downwards pressing load to the main horn unit, positioned above the lower apex of the main horn unit and near the symmetry axis thereof.

Especially noteworthy about the ultrasonic horn according to the present invention is that, when ultrasonic vibrations are input to at least one of the apexes on the left or right in a direction generally facing this apex and the lower apex, there is a region of the main unit with small amplitude vibrations. This region passes generally through the midpoint between the lower apex and left and right apexes, and has an arc-like shape with the curve of the arc facing convexly upwards. Particularly, a minimal vibration region (node region) exists above the lower apex of the horn main unit and on or near the symmetry axis. In bringing the lower apex (the vibration output portion) of the ultrasonic horn in contact with an object to be bonded, using this node region as a load application portion and applying a downward pressing load to this application portion yields the advantages of no inhibition of the vibrations of the ultrasonic horn, no propagation of ultrasonic vibrations to the load applying device connected to the load application portion, and no occurrence of multiple modes in the vibrations applied to the bonding portion. Moreover, the load application portion and the load output portion exist on the axis of the pressing vector or nearby, so no bending stress occurs in the ultrasonic horn, and the pressing load can be placed directly upon the object to be bonded.

Thus, the horizontal ultrasonic vibrations and vertical pressing load can be effectively applied to the object to be bonded, due to the point that horizontal ultrasonic vibrations can be obtained at the lower apex which is the vibration output portion, the point that ultrasonic vibrations are not propagated to the load applying device, the point that there is no flexing stress in the ultrasonic horn, and so forth. Accordingly, uniform and high-quality bonding can be realizing.

While rigidity has been necessary for conventional ultrasonic horns, thus limiting reduction in weight and size, there is no need to ensure rigidity to deal with bending of the horn with the ultrasonic horn according to the present invention, and accordingly, the size and weight of the horn can be reduced.

The ultrasonic horn preferably further comprises a detachable abutting member at the vibration output portion, formed of a wear-resistant material which comes into contact with the object to be bonded.

Materials with suitable vibrating properties are used for ultrasonic horns, but the materials are not necessarily durable materials. Accordingly, using an abutting member formed of a wear-resistant material at the lower apex (the vibration output portion) allows both vibration properties and durability to be realized. Also, even in the event that the abutting member wears out, the ultrasonic horn can be used over and over simply by replacing the abutting member.

The main horn unit may be positioned tilted as to the bonding face between the object to be bonded and the object to be bonded to, with the face of contact between the abutting member and the object to be bonded being parallel with the bonding face.

The components of the ultrasonic vibrations applied to the object to be bonded which are parallel to the bonding face, and the vertical components thereof, can be set at arbitrary ratios, so optimal bonding can be performed on various types of materials.

The main horn unit may have an upper side facing the lower apex, with the upper side thereof being formed in a symmetrical recessed or raised shape.

Changing the shape of the upper side of the ultrasonic horn changes the displacement distribution of the vibrations. Accordingly, the node point can be adjusted to be situated at a desired position by changing the shape of the upper side.

The thickness of the center portion of the main horn unit including the lower apex thereof, and the thickness of the ends thereof including the left and right apexes, may differ.

In this case, the amplitude of the ultrasonic vibrations output from the output portion and the driving force can be arbitrarily set, so the bonding conditions can be optimized according to the object to be bonded.

The vibration input portions may be provided to both left and right apexes on the main horn unit, with ultrasonic vibrations being input to one vibration input portion and ultrasonic vibrations of the reverse phase to the ultrasonic vibrations being input to the other vibration input portion.

In the event that ultrasonic vibrations are input to one of the apexes, left or right, vibrations synchronous to the input ultrasonic vibrations with a reverse phase occur at the other apex. Accordingly, when ultrasonic vibrations with reverse phase are input to both the left and right vibration input portions, greater ultrasonic vibrations are output from the lower apex than when ultrasonic vibrations are input to just one of the apexes. These output vibrations are also vibrations in a constant direction, and accordingly, this does not contradict the essence of the present invention.

Other features and advantages of the present invention will become apparent from the following description of embodiments of the invention which refers to the accompanying drawings.

BRIEF DESCRIPTION OF THE DRAWINGS

FIG. 5B is a displacement contour diagram of the ultrasonic horn;

DESCRIPTION OF EMBODIMENTS OF THE INVENTION

Figure 1:
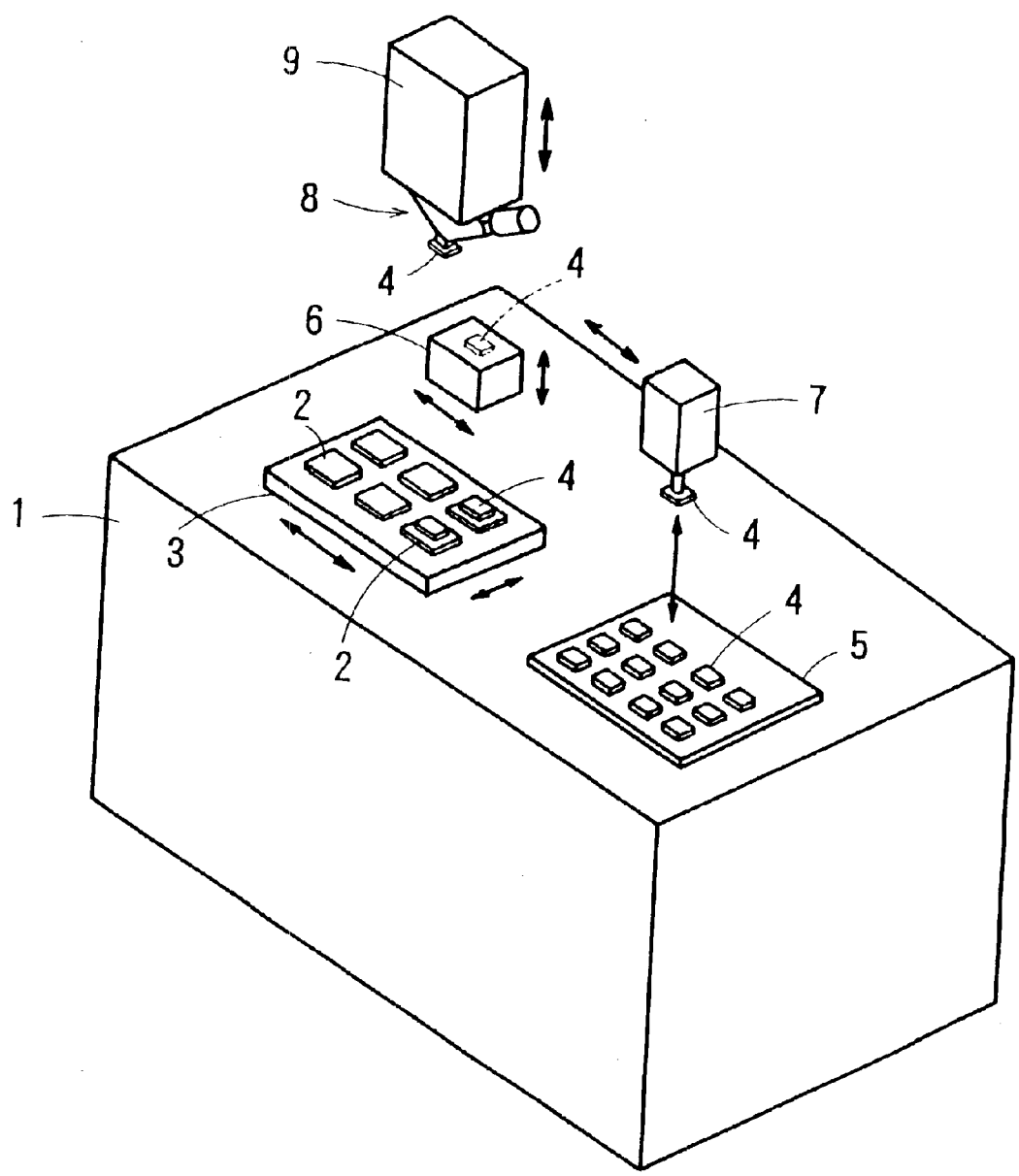
FIG. 1 is an overall perspective view of an ultrasonic bonding apparatus having an ultrasonic bonding head according to the present invention.

FIG. 1 illustrates the overall configuration of a bonding apparatus having an ultrasonic bonding head according to the present invention.

Arranged on the upper face of an apparatus frame 1 of this bonding apparatus is a mounting stage 3 where boards 2, serving as an example of objects to be bonded to, are loaded and held, and a parts supply 5 where parts 4 such as chip parts with bumps, serving as an example of objects to be bonded, are arrayed and stored. Provided above the apparatus frame 1 is a parts transporting stage 6, a parts supply unit 7 for supplying parts 4 retrieved from the parts supply 5 to the parts transporting stage 6, an ultrasonic bonding head 8 for taking the part 4 supplied to the parts transporting stage 6 and bonding the part 4 to the board 2 on the mounting stage 3, and an elevating block 9 for ascending or descending while supporting the ultrasonic bonding head 8.

Now, the mounting stage 3 is configured to be capable of moving horizontally forwards and backwards, and to the left and right, in order to be positioned for parts 4 held by the ultrasonic bonding head 8. Also, the parts transporting stage 6 is configured to be capable of moving vertically and horizontally, to transport the parts 4 supplied by the parts supplying unit 7 to the vertical moving path of the ultrasonic bonding head 8, and hand the parts 4 to the ultrasonic bonding head 8.

Figure 2:
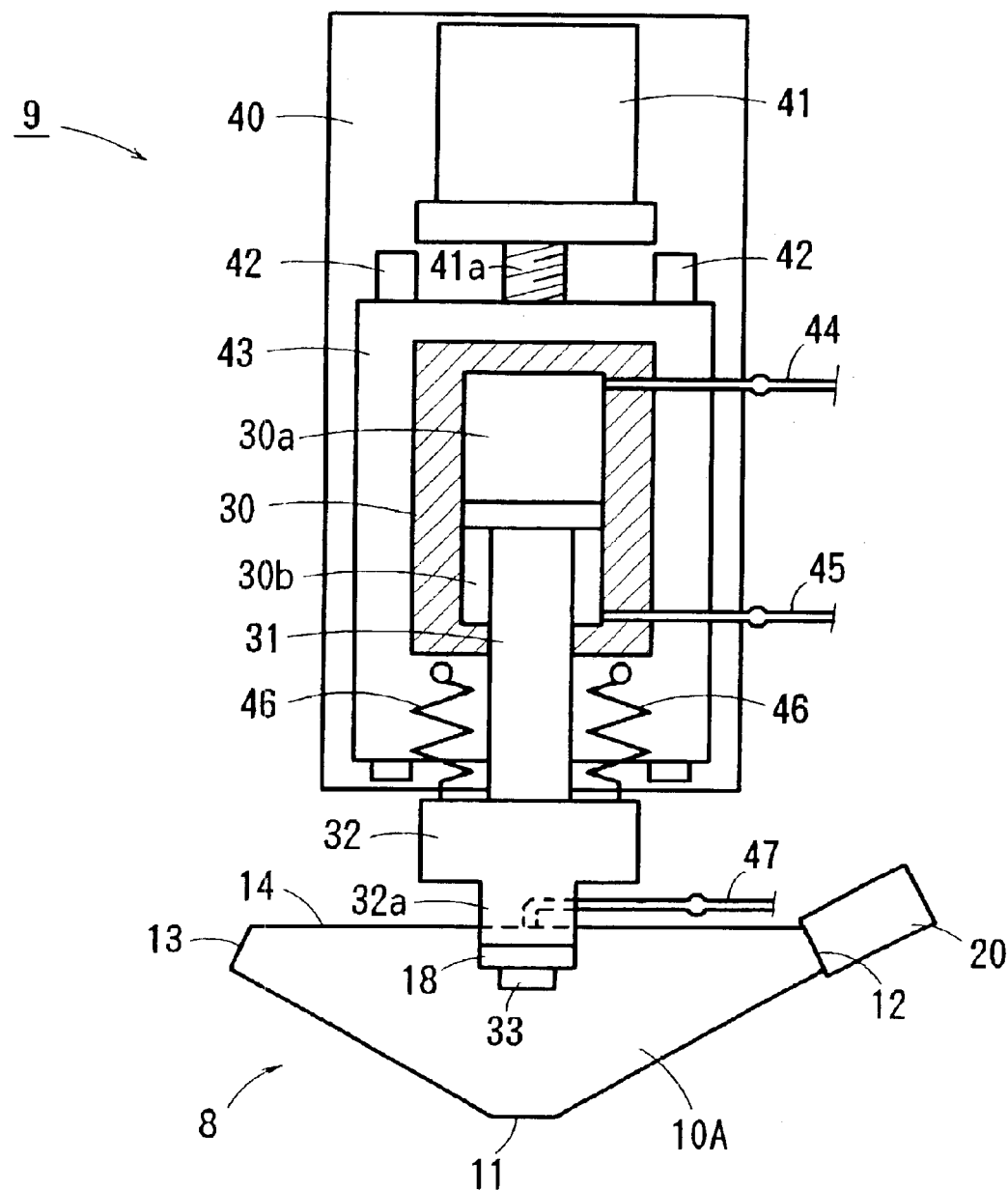
FIG. 2 is an internal configuration of an elevating block shown in FIG. 1.

FIG. 2 illustrates an example of a specific configuration of the elevating block 9. The elevating block 9 comprises a base 40, an elevating device 41 made up of a servo motor fixed to the base 40, a slide plate 43 attached to the base 40 so as to be vertically movable by a guide 42, a load applying device 30 formed of an air cylinder fixed to the slide plate 43, as well as other members. The rotating shaft of the elevating device 41 is configured of a screw shaft 41a, with the screw shaft 41a being screwed to a nut portion (not shown) provided to the slide plate 43. Driving the elevating device 41 vertically moves the slide plate 43, so as to allow the part 4 (not shown) held by the later-described ultrasonic horn 10A to be lowered to the board 2 (not shown). The load applying device 30 has a piston rod 31, and a pressing jig 32 is fixed on the bottom end of the piston rod 31. As described later, the pressing jig 32 is linked to a connecting portion 18 of the ultrasonic horn 10A. Supplying pressurized air to one chamber 30a of the load applying device 30 via tubing 44 produces a downwards pressing load to the ultrasonic horn 10A via the piston rod 31. On the other hand, the air existing on the other chamber 30b can be discharged via the tubing 45. Springs 46 serving as load cancelers for the ultrasonic horn 10A are strung between the slide plate 43 and the pressing jig 32. Accordingly, the weight of the ultrasonic horn 10A itself does not act as the pressing weight applied on the objects to be bonded (i.e., the part 4 and board 2) from the ultrasonic horn 10A, so that this pressing weight can be adjusted by the air pressure supplied to the chamber 30a of the load applying device 30 alone.

Note that an arrangement may be made wherein the weight of the ultrasonic horn 10A itself is cancelled by supplying pressurized air to the other chamber 30b via the tubing 45, instead of by the springs 46.

While an air cylinder is used as the load applying device 30 in the above embodiment, the present invention is not restricted to this, and other means may be used instead, such as voice coil motors, motor and ball screw mechanism combinations, and so forth.

Figure 3:
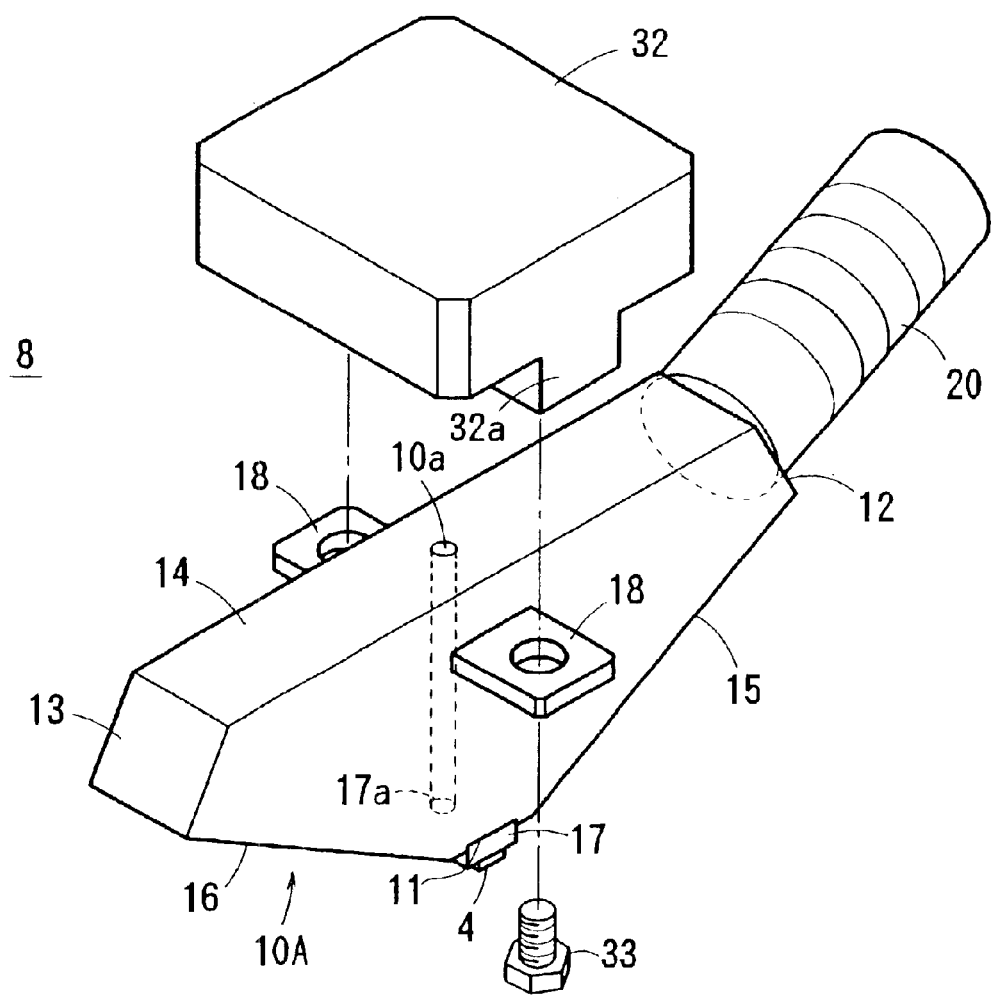
FIG. 3 is a perspective view of an ultrasonic bonding head according to a first embodiment of the present invention.
Figure 4:
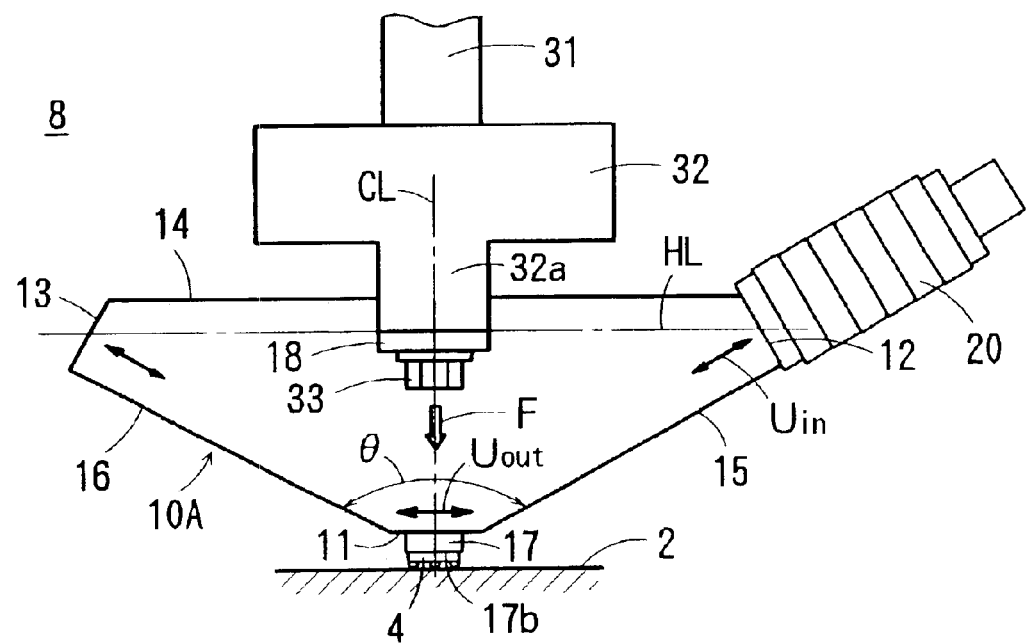
FIG. 4 is a front view of the ultrasonic bonding head shown in FIG. 3.

FIGS. 3 and 4 illustrate a detailed configuration of a first embodiment of the ultrasonic bonding head 8. This ultrasonic bonding head 8 bonds a part 4 with bumps to a board 2 as described above, by applying a pressing load and ultrasonic vibrations, and comprises an ultrasonic horn 10A.

The main unit of the ultrasonic horn 10A is a block-shaped member integrally formed in the shape of an inverted isosceles triangle, which made of metal material such as an aluminum alloy, refractory metal, titanium alloy, stainless steel, or the like. The ultrasonic horn 10A has a lower apex 11 and left and right apexes 12 and 13, with cut faces being formed at the lower apex 11 and the left and right apexes 12 and 13. The cut face on the lower apex 11 is perpendicular to a horizontal symmetry axis CL, and in this case is parallel to the upper side 14. The cut faces of the left and right apexes 12 and 13 are perpendicular to the direction of facing the lower apex 11, and in this case, are approximately perpendicular to the hypotenuses 15 and 16, respectively. The apex angle $\theta$ at the lower apex 11 in the present embodiment is within the range of 60° to 150°, and more preferably within the range of 90° to 120°.

An abutting member 17 formed of a wear-resistant material (e.g., refractory metal, ceramic, diamond, etc.) is detachably fixed to the cut face of the lower apex 11 of the ultrasonic horn 10A. The face of contact 17b between the abutting member 17 and the part 4 is a flat face finished to have a desired surface coarseness, with a suction hole 17a for applying suction to the part 4 being formed in the abutting member 17. This suction hole 17a communicates with a suction hole 10a provided to the ultrasonic horn 10A, and the top of the suction hole 10a is connected with a vacuum suctioning device (not shown) via vacuum tubing 47 shown in FIG. 2. The vacuum tubing 47 is preferably a hose formed of a resilient material.

A piezoelectric vibrator 20 is fixed to the cut face of one of the apexes (the right apex 12 in this case) of the ultrasonic horn 10A, to provide ultrasonic vibrations to the right apex 12 of the ultrasonic horn 10A in a direction facing the lower apex 11. Here, the cut face of the right apex 12 is approximately perpendicular to the hypotenuse 15, so the direction of vibrations is almost parallel with the hypotenuse 15. The angle between the direction of vibrations and the hypotenuse 15 may be around ±10°. A vibration frequency within the range of 20 kHz to 200 kHz is preferable. 60 kHz was used in this case. Also, flange-shaped connecting portions 18 (see FIG. 3) are erected on both front and back sides of the ultrasonic horn 10A, around the center of the upper side 14 facing the lower apex 11 and somewhat lower than the upper side 14. The connecting portions 18 are provided at the node portion of vibrations as described later, and the length of protrusion of the connecting portions 18 is calculated so that there is no resonance with the ultrasonic vibration frequency. The piston rod 31 (FIG. 2) of the load applying device 30 is linked to the connecting portions 18 by the pressing jig 32. The pressing jig 32 has two legs 32a protruding downwards, with the legs 32a being fixed to the connecting portions 18 by tightening devices 33 such as bolts or the like. Accordingly, the pressing jig 32 comes in contact with no portions of the ultrasonic horn 10A other than the connecting portions 18.

Figure 5A:
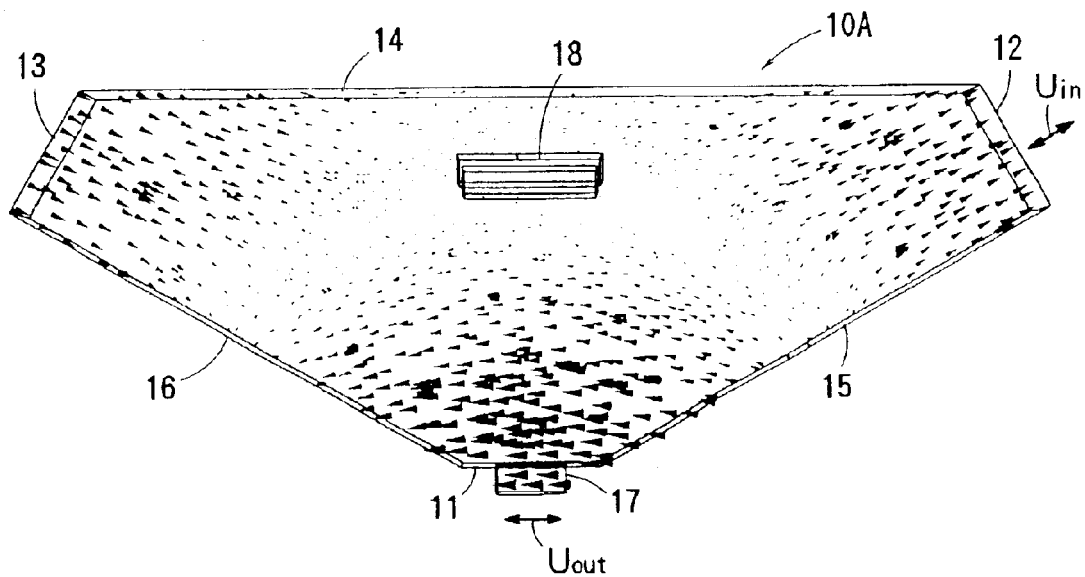
FIG. 5A is a displacement vector diagram of an ultrasonic horn used in the ultrasonic bonding head shown in FIG. 3.
Figure 5A:
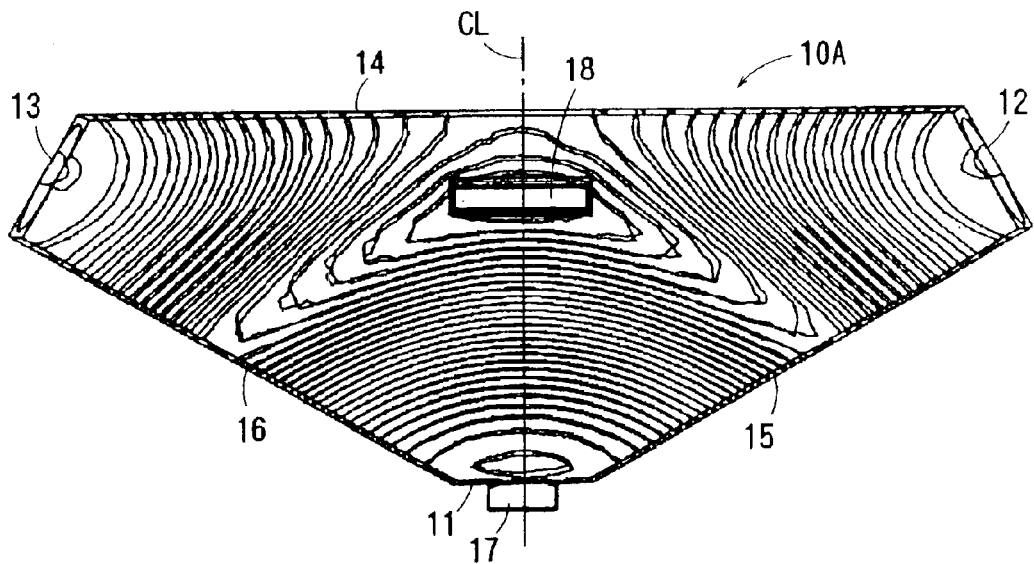

The operating principle of the ultrasonic horn 10A will be described with reference to FIGS. 5A and 5B, wherein FIG. 5A is a displacement vector diagram, and FIG. 5B is a displacement contour diagram.

Inputting ultrasonic vibrations Uin which are parallel to the hypotenuse 15 to the right apex 12, for example, to the ultrasonic horn 10A configured as described above, generates displacement vectors such as indicated by the triangle arrows in FIG. 5A. FIG. 5A illustrates the displacement vectors at a certain instant, and the larger the triangle, the greater the amplitude. When diagonal vibrations Uin are input to the right apex 12, diagonal vibrations parallel to the hypotenuse 16 also occur at the left apex 13, and ultrasonic vibrations Uout perpendicular to the horizontal symmetry axis CL, i.e., substantially horizontal (100% horizontal vibration component and 0% vertical vibration component), are output to the lower apex 11. Moreover, the amplitude of the output vibrations Uout at the lower apex 11 is greater in amplitude than the input vibrations Uin at the right apex 12. This means that the vibrations of the ultrasonic vibrations Uin input from the right apex 12 are amplified and great ultrasonic vibrations Uout are output from the lower apex 11.

As shown in FIGS. 5A and 5B, a region where vibrations are small exists in an arc-shaped area passing approximately through the middle of the hypotenuses 15 and 16 of the ultrasonic horn 10A. Particularly, a minimal vibration region (node region) exists somewhat below the center portion of the upper side 14 facing the lower apex 11, on or near the symmetry axis CL. Connecting portions 18 provided within the node region are used as load applying portions, so connecting the load applying device 30 (pressing jig 32) to the connecting portions 18 enables an arrangement wherein there is no propagation of ultrasonic vibrations to the load applying device 30 from the connecting portions 18, and accordingly there is no disturbance of the vibration. Also, as shown in FIG. 4, applying a downward pressing load F with the load applying device 30 means that the vector of the pressing load F passes through the lower apex 11, so there is no flexing of the ultrasonic horn 10A, and the pressing load F can be placed directly upon the lower apex 11.

Note that the portion for linking the load applying device 30 does not need to be restricted to the above-described minimal vibration region. Approximately the same advantages can be obtained by linking the load applying device 30 in the above-described arc-shaped area where vibrations are small, at a position where the total vector of the pressing load F passes through the lower apex 11.

As described above, horizontal ultrasonic vibrations Uout with great amplitude are obtained at the lower apex 11 serving as the output portion, and the ultrasonic vibrations are not impeded by the load applying device 30. The axis of the vector of the pressing load F applied to the connecting portions 18 passes through he lower apex 11, so there is no flexing of the ultrasonic horn 10A. Accordingly, the ultrasonic vibrations and pressing load can be uniformly applied to the entire bonding face, thus yielding a uniform good bond.

Note that since the ultrasonic horn 10A is horizontally symmetrical, the same advantages are obtained regardless whether the input portion for the ultrasonic vibrations is the apex 12 or the apex 13.

Figure 6:
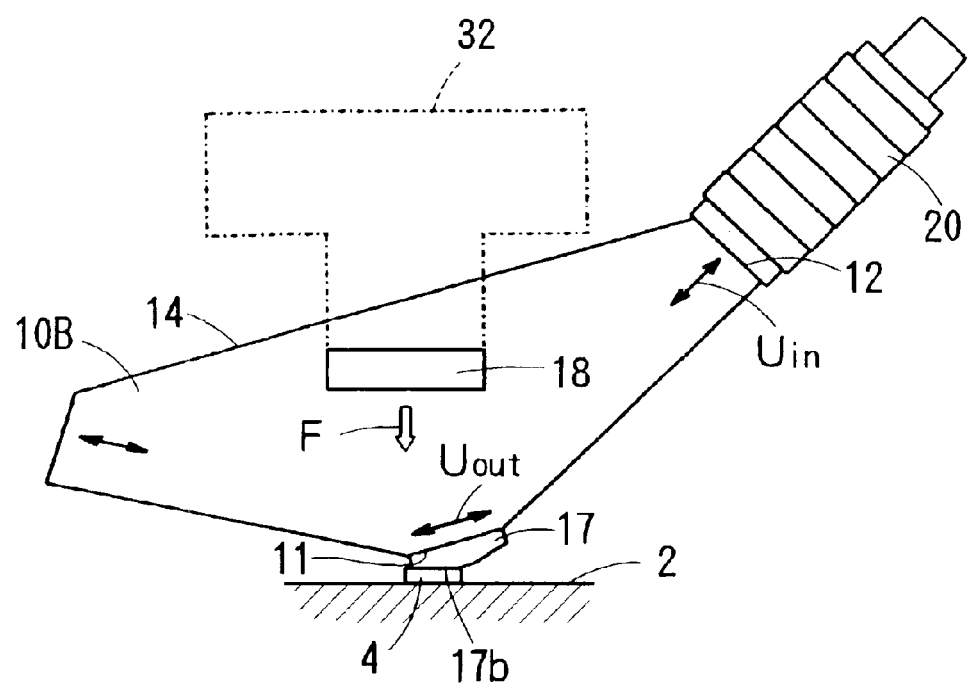
FIG. 6 is a front diagram of an ultrasonic bonding head according to a second embodiment.

FIG. 6 illustrates a second embodiment of the ultrasonic bonding head according to the present invention. This embodiment is an arrangement wherein an ultrasonic horn 10B, having the same form as the ultrasonic horn 10A in the first embodiment, is tilted as to the bonding face, and the abutting member 17 is formed with a chevron shape so that the contact face 17b with the object to be bonded 4 is parallel with the bonding face.

Also, the connecting portions 18 provided to the ultrasonic horn 10B are tilted as to the upper side 14 so as to be fixed parallel with the bonding face.

In this case, ultrasonic vibrations Uout in the diagonal direction as indicated by the arrow are output to the lower apex 11 serving as the output portion, so the abutting member 17 provides diagonal vibrations to the object to be bonded 4. Tilting the ultrasonic horn 10B thus and adjusting the angle of the contact face 17b of the abutting member 17 allows setting of an arbitrary ratio of the components of the ultrasonic vibrations applied to the object to be bonded 4 that are parallel to the bonding face and the vertical components thereof. Accordingly, bonding can be optimized for a wide variety of materials.

Note that while the direction of the vector of the pressing load F of the load applying device 30 is somewhat offset from the face of contact between the abutting member 17 and the object to be bonded 4, there is hardly any effect on the bonding.

Figure 7:
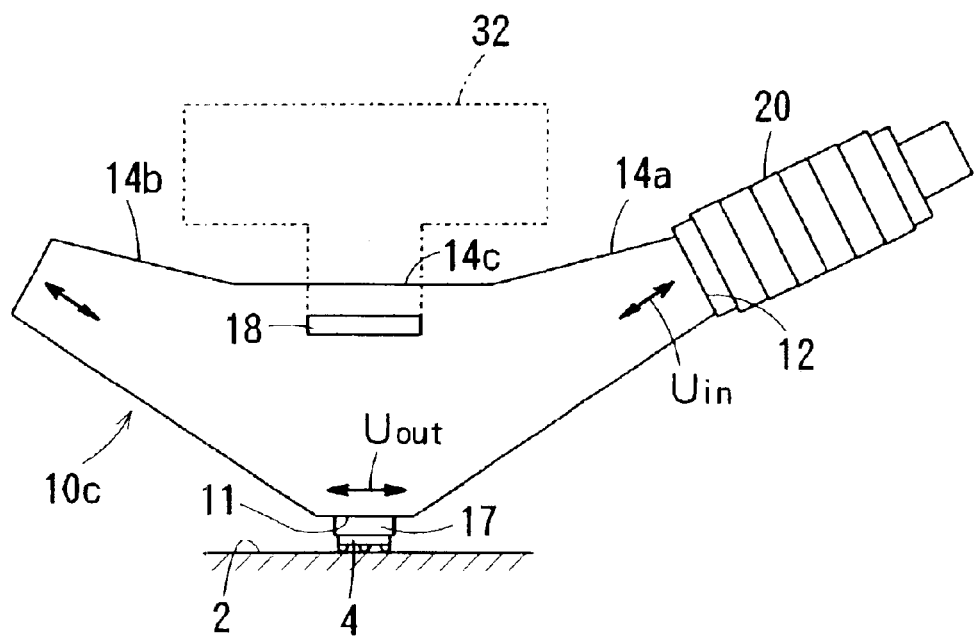
FIG. 7 is a front diagram of an ultrasonic bonding head according to a third embodiment.

FIG. 7 illustrates a third embodiment of the ultrasonic bonding head according to the present invention. This embodiment is an arrangement wherein the upper side 14 of an ultrasonic horn 10C is formed in a recessed shape, having two inclined faces 14a and 14b, and a base 14c. Other configurations are the same as those described with the first embodiment (see FIG. 4), so these components will be denoted with the same reference numerals and redundant description will be omitted.

Figure 8A:
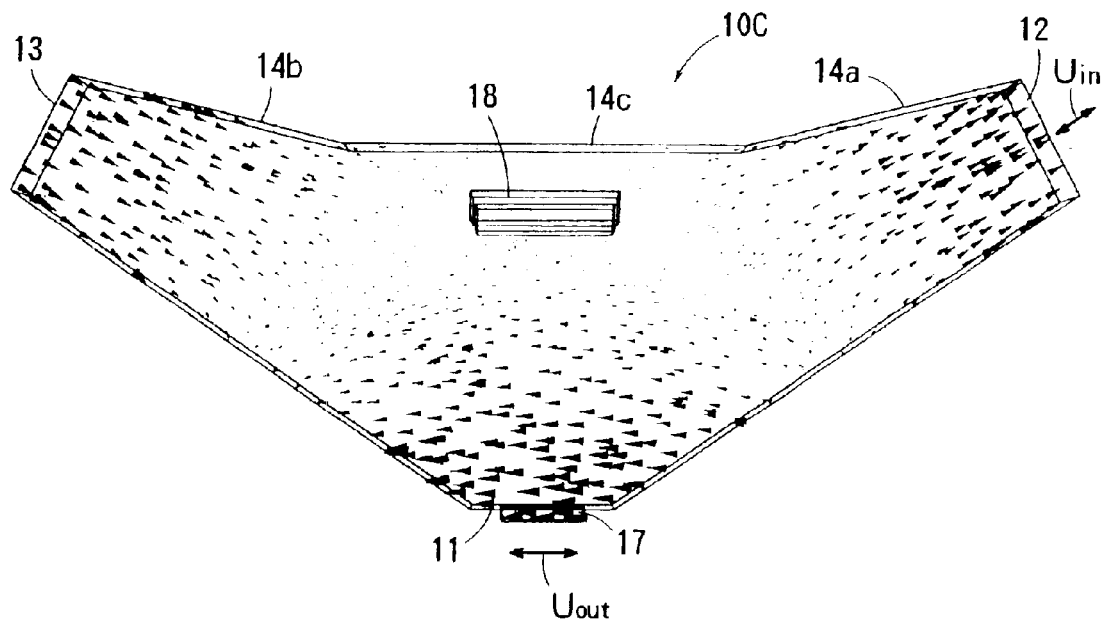
FIG. 8A is a displacement vector diagram of an ultrasonic horn used in the ultrasonic bonding head shown in FIG. 7.
Figure 8B:
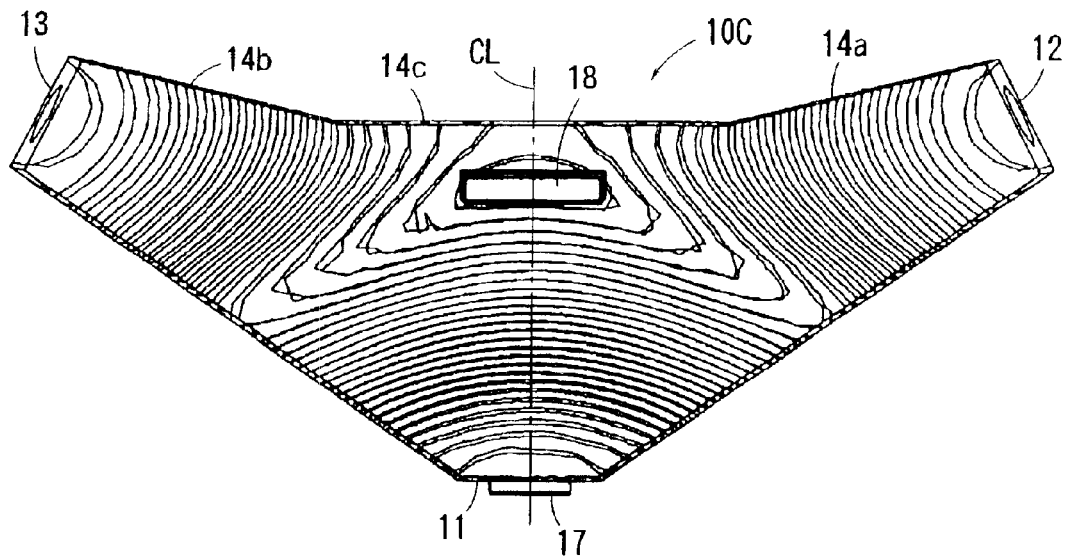
FIG. 8B is a displacement contour diagram of the ultrasonic horn.

FIG. 8A is a displacement vector diagram of the ultrasonic horn 10C, and FIG. 8B is a displacement contour diagram thereof.

As can be clearly understood from FIGS. 8A and 8B, upon ultrasonic vibrations being input to one of the apexes 12 and 13, toward the lower apex 11, only horizontal ultrasonic vibrations (100% horizontal vibration component and 0% vertical vibration component), are output to the lower apex 11. Moreover, the output vibrations are greater than the input vibrations.

Figure 9:
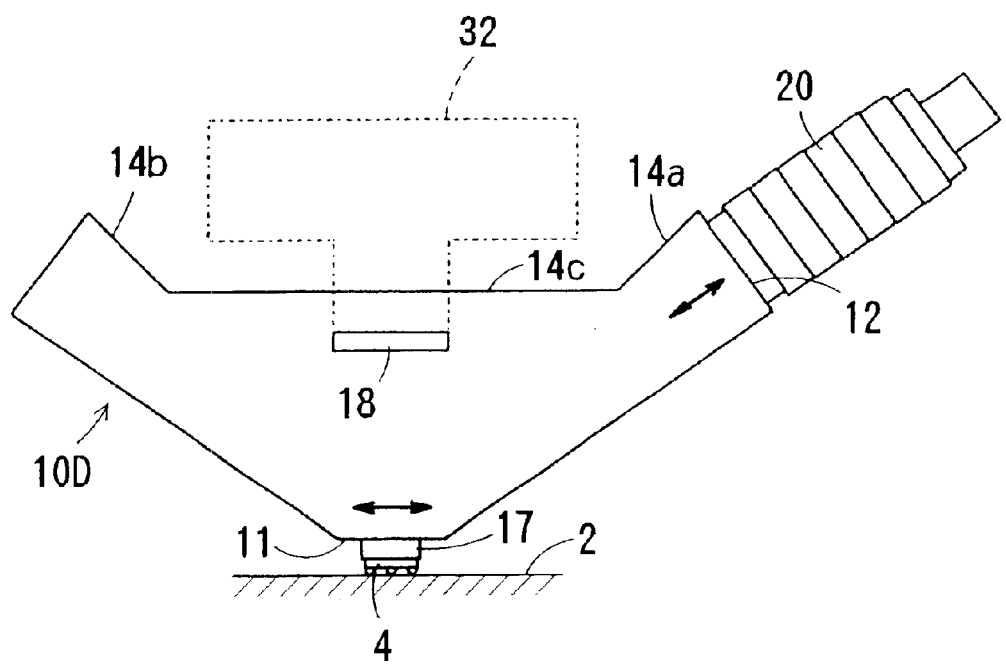
FIG. 9 is a front diagram of an ultrasonic bonding head according to a fourth embodiment.

FIG. 9 illustrates a fourth embodiment of the ultrasonic bonding head according to the present invention. This embodiment is a modification of the third embodiment, wherein the upper side 14 of an ultrasonic horn 10D is formed in a recessed shape, having two inclined faces 14a and 14b, and a base 14c, wherein the angle of the inclined faces 14a and 14b is steeper as compared to the third embodiment, and the base 14c is broader.

Figure 10:
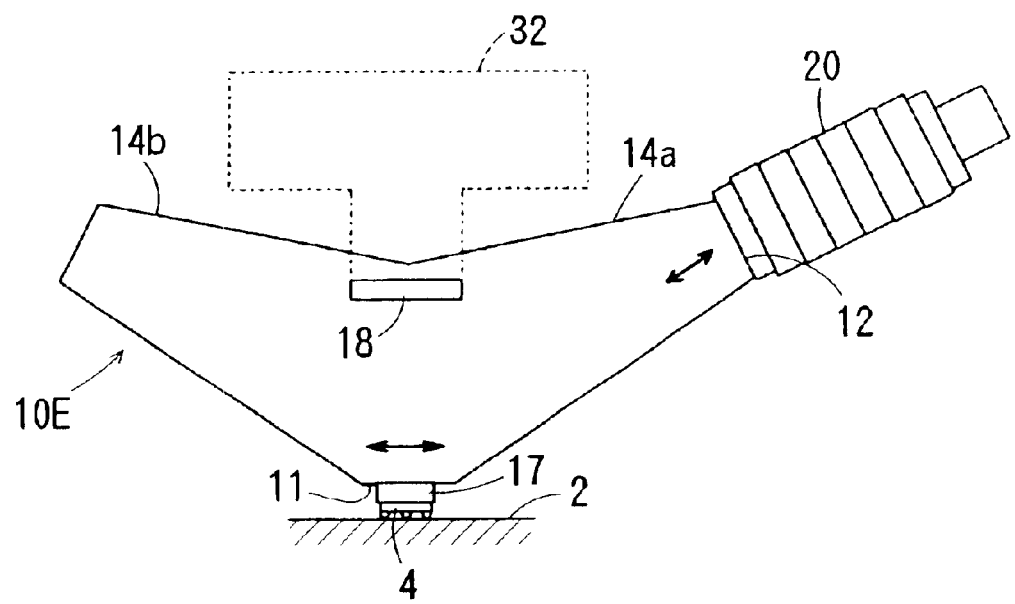
FIG. 10 is a front diagram of an ultrasonic bonding head according to a fifth embodiment.

FIG. 10 illustrates a fifth embodiment of the ultrasonic bonding head according to the present invention. This embodiment is an arrangement wherein the upper side 14 of an ultrasonic horn 10E is formed in a V-shape, having two inclined faces 14a and 14b. This arrangement has no horizontal face on the upper side 14, so the direction of the ultrasonic vibrations output from the output portion are not parallel with the upper side 14, but rather perpendicular to the horizontal symmetry axis of the horn main unit.

Figure 11:
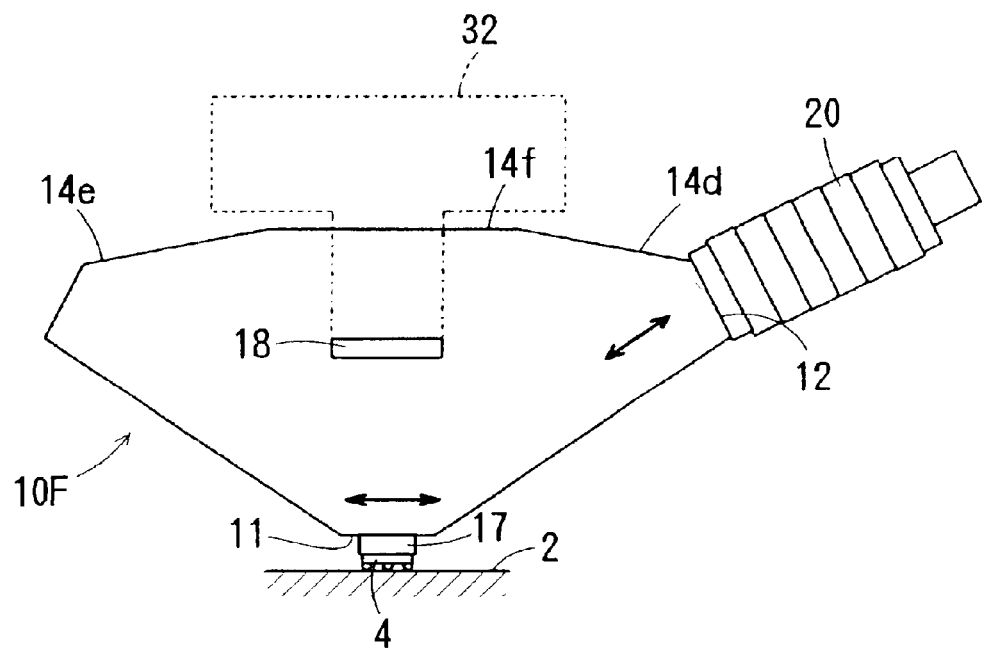
FIG. 11 is a front diagram of an ultrasonic bonding head according to a sixth embodiment.

FIG. 11 illustrates a sixth embodiment of the ultrasonic bonding head according to the present invention. This embodiment is an arrangement wherein the upper side 14 of an ultrasonic horn 10F is formed in a convex raised shape, having two inclined faces 14d and 14e, and a top face 14f.

As indicated by the third through sixth embodiments, the displacement distribution of vibrations can be adjusted to a desired displacement distribution by changing the shape of the upper side 14 of the ultrasonic horn 10C through 10F.

Figure 12:
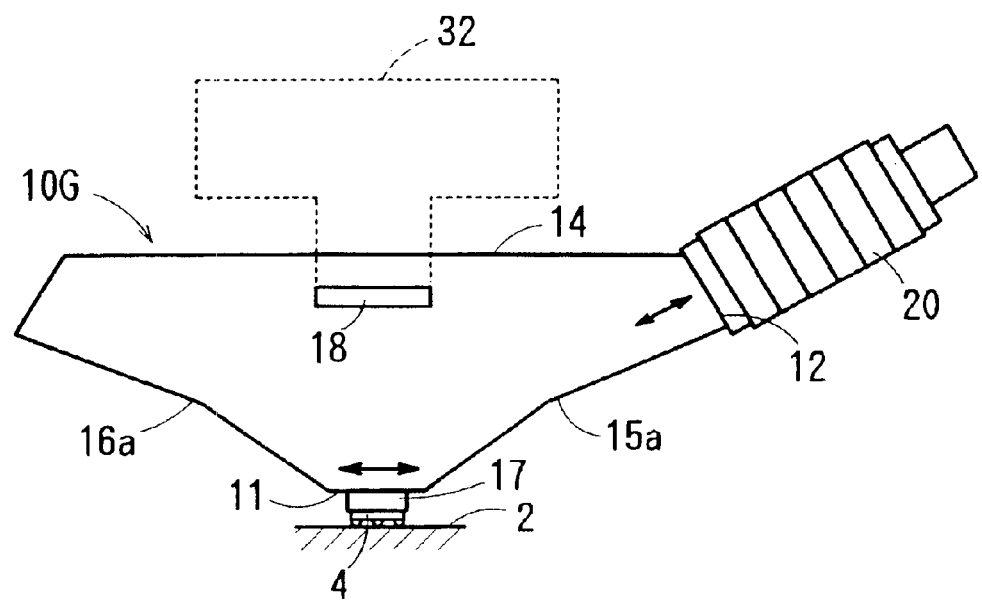
FIG. 12 is a front diagram of an ultrasonic bonding head according to a seventh embodiment.

FIG. 12 illustrates a seventh embodiment of the ultrasonic bonding head according to the present invention. This embodiment is an arrangement wherein the hypotenuses 15a and 16b of an ultrasonic horn 10G are formed bending concavely upwards, rather than being flat.

In this case as well, the displacement distribution of vibrations can be adjusted in the same way as changing the shape of the upper side 14.

While the ultrasonic horn 10G is not symmetrical in the strictest sense, with this embodiment, advantages the same as the ultrasonic horns 10A through 10F in the first through sixth embodiments can be obtained.

Figure 13:
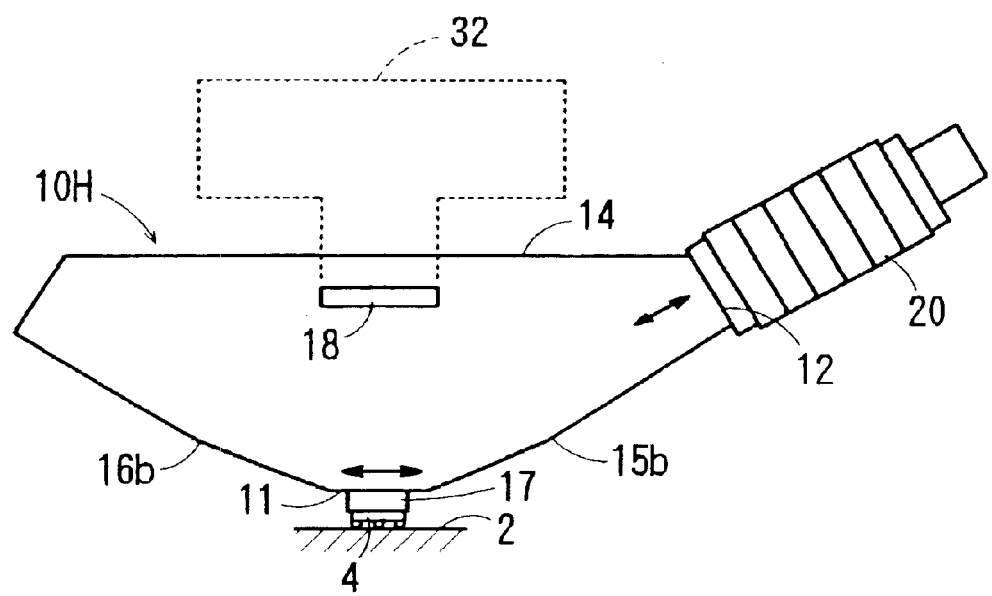
FIG. 13 is a front diagram of an ultrasonic bonding head according to a eighth embodiment.

FIG. 13 illustrates an eighth embodiment of the ultrasonic bonding head according to the present invention. This embodiment is an arrangement wherein the hypotenuses 15b and 16b of an ultrasonic horn 10H are formed bending convexly downwards. In this case as well, the displacement distribution of vibrations can be adjusted. Also, this ultrasonic horn 10H is not symmetrical in the strictest sense.

Figure 14:
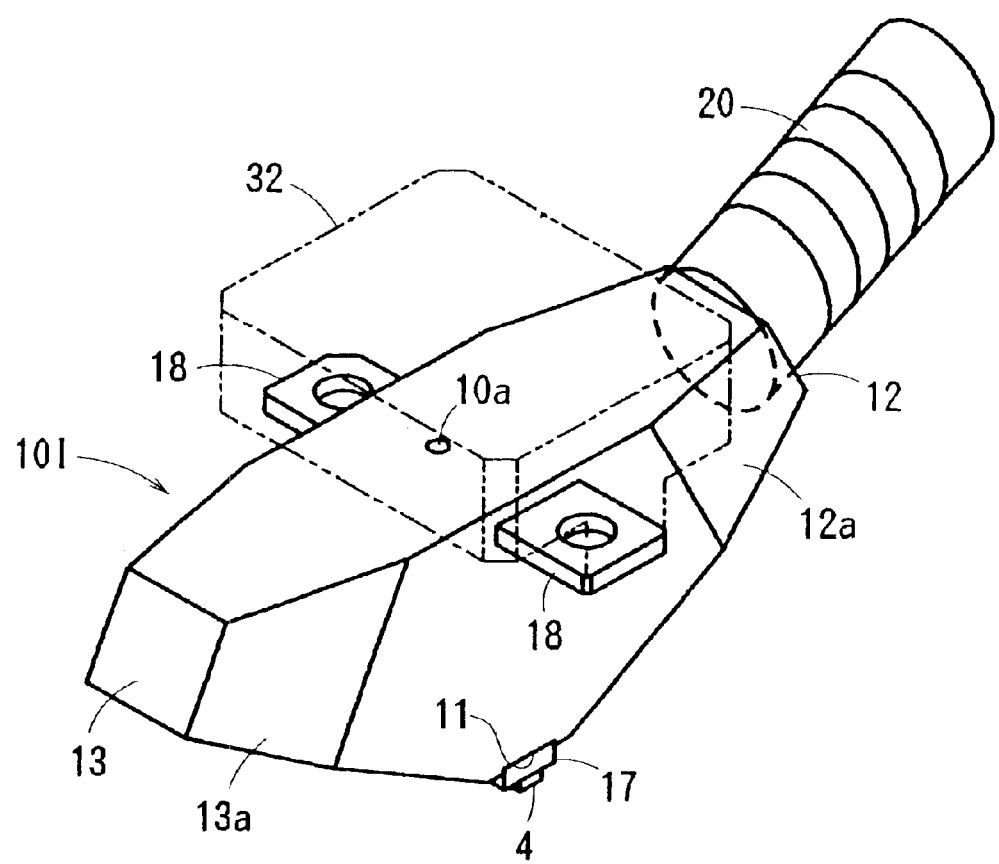
FIG. 14 is a perspective diagram of an ultrasonic bonding head according to a ninth embodiment.

FIG. 14 illustrates a ninth embodiment of the ultrasonic bonding head according to the present invention. This embodiment is an arrangement wherein the thickness of the center portion of an ultrasonic horn 10I including the lower apex 11 is increased progressively with respect to the thickness of both end portions including the left and right apexes 12 and 13, by providing inclined faces 12a and 13b therebetween.

In this case, the amplitude is smaller since the thickness of the lower apex 11 where the ultrasonic vibrations Uout are output is greater than the thickness of the right apex 12 where the ultrasonic vibrations Uin are input, but the driving force is greater.

Figure 15:
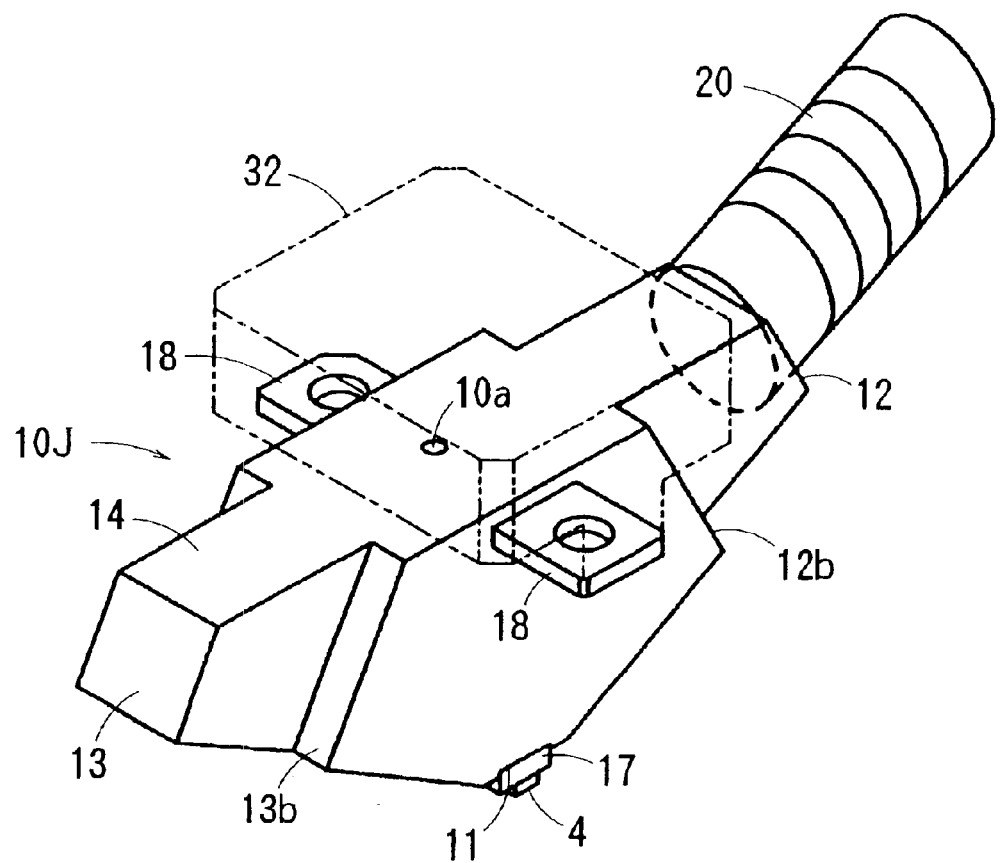
FIG. 15 is a perspective diagram of an ultrasonic bonding head according to a tenth embodiment.

FIG. 15 illustrates a tenth embodiment of the ultrasonic bonding head according to the present invention. This embodiment is an arrangement wherein the thickness of the center portion of an ultrasonic horn 10J including the lower apex 11 is greater than the thickness of both end portions including the left and right apexes 12 and 13, by providing stepped portions 12b and 13b therebetween.

In this case as well, the amplitude is smaller since the thickness of the lower apex 11 where the ultrasonic vibrations Uout are output is greater than that of the right apex 12 where the ultrasonic vibrations Uin are input, but the driving force is greater, as with the ninth embodiment.

Thus, changing the thickness of portions of the ultrasonic horns 10I and 10J allows the amplitude and driving force to be arbitrarily adjusted.

Figure 16:
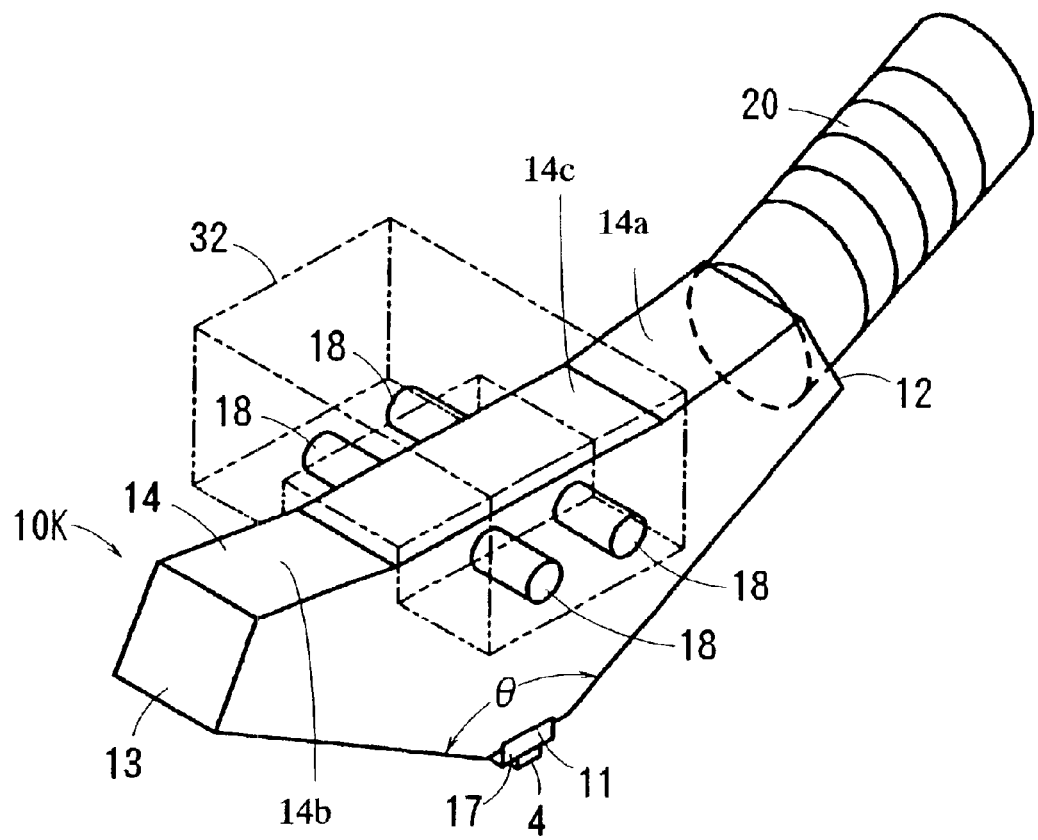
FIG. 16 is a perspective diagram of an ultrasonic bonding head according to a eleventh embodiment.

FIG. 16 illustrates an eleventh embodiment of the ultrasonic bonding head according to the present invention. This embodiment is an arrangement wherein the upper side 14 of an ultrasonic horn 10K is formed in a recessed shape, having two inclined faces 14a and 14b, and a base 14c, as with the third embodiment (see FIG. 8), with the connecting portions 18 each comprising two rods protruding from the sides of the ultrasonic horn 10K.

In the event that the apex angle θ of the lower apex 11 of the ultrasonic horn 10K is 120° or grater, the vibration node point divides into two regions. Providing the connecting portions 18 to each of the node points allows the pressing load to be applied to the node points alone, thus stabilizing the vibration properties. This arrangement is easy to manufacture and costs can be reduced.

While this example shows the upper face 14 of the ultrasonic horn 10K as a recessed shape, this may be a flat face as with the first embodiment, or a raised shape as with the sixth embodiment.

Figure 17:
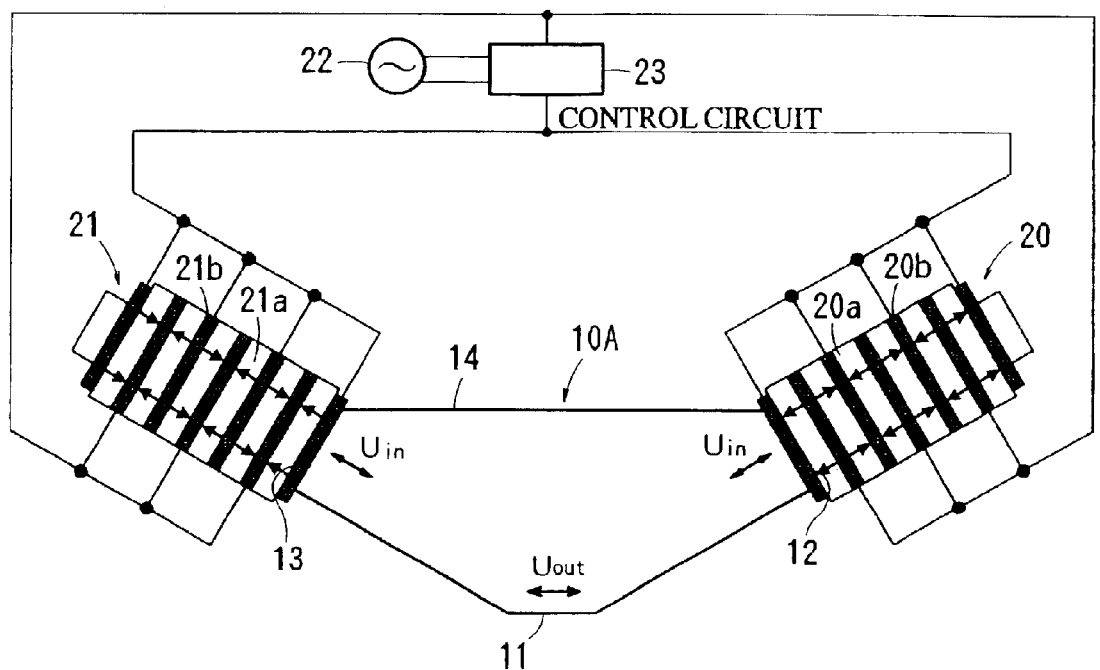
FIG. 17 is a schematic diagram of an ultrasonic bonding head according to a twelfth embodiment.

FIG. 17 illustrates a twelfth embodiment of the ultrasonic bonding head according to the present invention. This embodiment is an arrangement wherein vibrators 20 and 21 are attached to both the left and right apexes 12 and 13 of the ultrasonic horn 10A. The vibrators 20 and 21 have a known configuration wherein multiple piezoelectric devices 20a and 21a are alternated with multiple electrode plates 20b and 21b, with the piezoelectric devices 20a and 21a being polarized in the thickness direction thereof as indicated by the arrows.

The vibrators 20 and 21 are configured so that the ultrasonic vibration phases generated thereby are opposite. Here, the polarization directions of the piezoelectric devices 20a and 21a making up the vibrators 20 and 21 are reverse, and the electrode plates 20b and 21b are connected to a power source 22 in parallel. Reference numeral 23 denotes a control circuit for controlling the vibrators 20 and 21.

As described above, the phases of the ultrasonic vibrations input to the left and right apexes 12 and 13 are opposite, so ultrasonic vibrations with a greater driving force can be output from the lower apex 11 as compared to an arrangement wherein the ultrasonic vibrations are input to only one of the left and right apexes 12 and 13.

Figure 18:
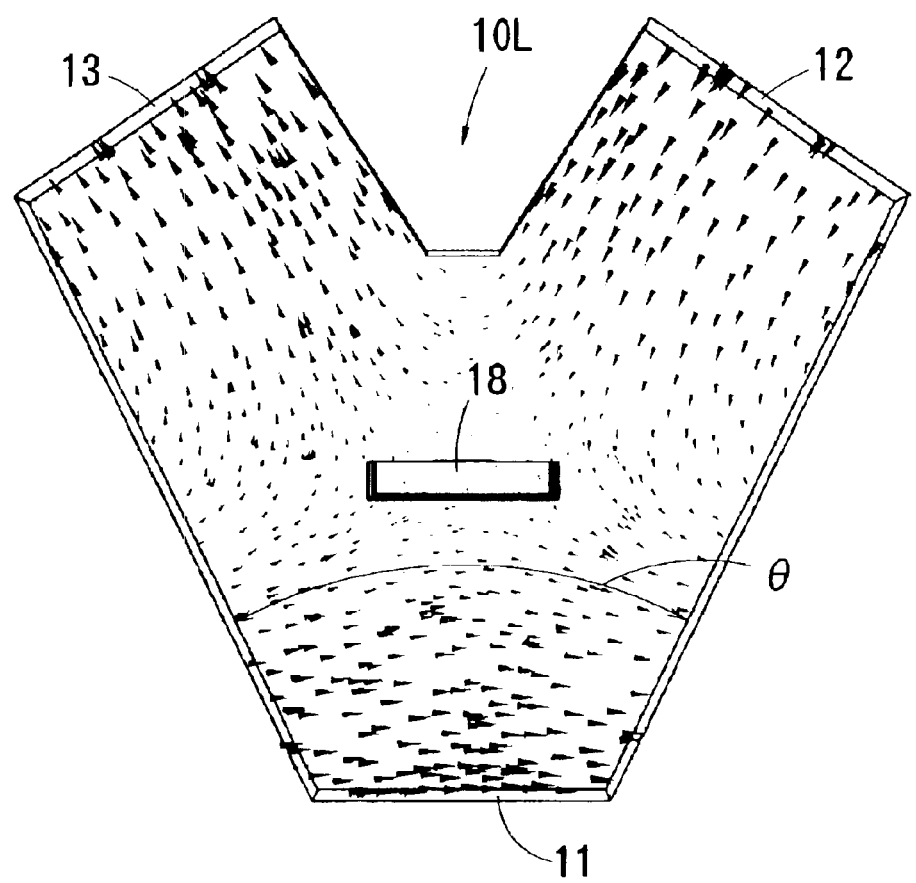
FIG. 18 is a displacement vector diagram of an ultrasonic horn according to a thirteenth embodiment.

FIG. 18 illustrates a thirteenth embodiment of the ultrasonic horn according to the present invention. This embodiment is an arrangement wherein the apex angle θ of the lower apex 11 of the ultrasonic horn 10L is 60°, and the overall shape is V-shaped. In this case as well, as can be clearly understood from the displacement vectors in FIG. 18, upon ultrasonic vibrations toward the lower apex 11 being input from at least one of the left and right apexes 12 and 13, only horizontal ultrasonic vibrations (100% horizontal vibration component and 0% vertical vibration component) are output to the lower apex 11.

Figure 19:
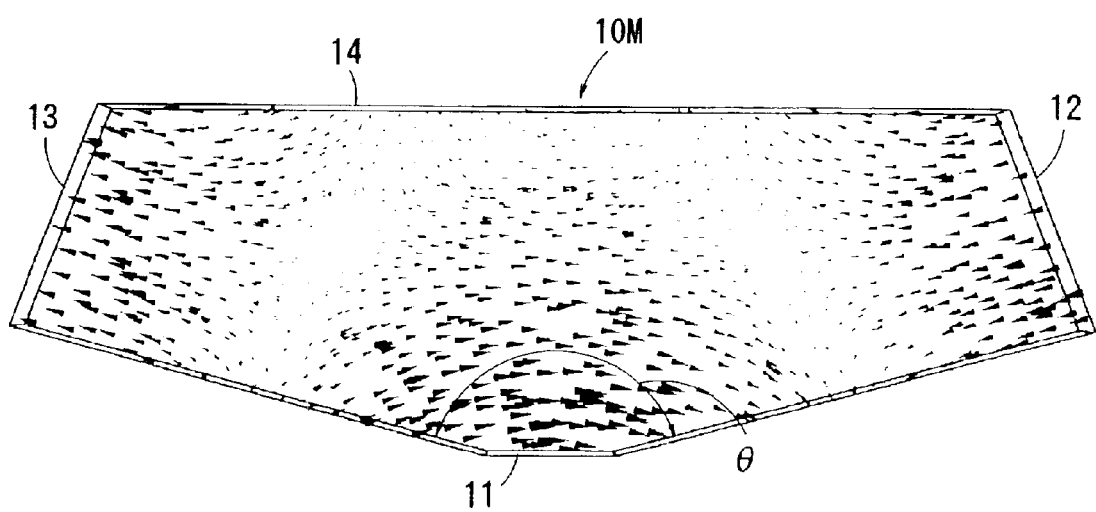
FIG. 19 is a displacement vector diagram of an ultrasonic horn according to a fourteenth embodiment.

FIG. 19 illustrates a fourteenth embodiment of the ultrasonic horn according to the present invention. This embodiment is an arrangement wherein the apex angle θ of the lower apex 11 of the ultrasonic horn 10M is 150°. In this case as well, as can be clearly understood from the displacement vectors in FIG. 19, upon ultrasonic vibrations being input toward the lower apex 11 from at least one of the left and right apexes 12 and 13, only horizontal ultrasonic vibrations are output to the lower apex 11.

While the above embodiments have been described with reference to flip chip mounting of parts with bumps to a board, the present invention can also be used for bonding chips having multiple leads to a tape, called TAB, and for bonding metal to metal. That is to say, the present invention can be applied to all apparatuses in which metal is bonded to metal using ultrasonic vibrations.

Also, while the ultrasonic bonding apparatuses (ultrasonic bonding heads) in the above embodiments perform bonding by applying ultrasonic vibrations and a pressing load, heat may be applied as well. In this case, a heating device for heating the ultrasonic horn and mounting stage is added.

Also, while an abutting member is attached to the lower apex of the ultrasonic horns in the above embodiments, the lower apex does not need to be directly brought into contact with the object to be bonded. Further, while a horizontal cut face is provided to the lower apex in the embodiments, this type of cut face is not indispensable, and the lower apex may be of an arbitrary shape.

Further, while the load applying device 30 in the above embodiments is provided separately from the elevating device 41, the elevating device 41 may serve as the load applying device 30.

In addition to the advantages of the present invention described above, the present invention also has the following advantages, as has been made clear through the embodiments.

There is no need to take rigidity into consideration to deal with flexing of the ultrasonic horn with the present invention, so small and lightweight horns can be realized using materials with high vibration properties but low rigidity, such as aluminum alloys and titanium alloys, thereby improving vibration properties. Also, reduction in size and weight improves the speed and precision of operations, so high-precision bonding can be realized at low costs.

Also, the lower apex of the ultrasonic horn, which directly or indirectly comes into contact with the object to be bonded, protrudes downwards, so bonding can be carried out without interfering with obstacles (other parts, etc.) which may be present around the bonding face.

Although the present invention has been described in relation to particular embodiments thereof, many other variations and modifications and other uses will become apparent to those skilled in the art. Therefore, the present invention is not limited by the specific disclosure herein.

What is claimed is:

1. An ultrasonic horn for applying ultrasonic vibrations to an object to be bonded to another object, said ultrasonic horn comprising:

a main horn unit having left and right apexes and a lower apex, formed generally symmetrical horizontally;

a vibration input portion provided at at least one of the left and right apexes of said main horn unit; and a vibration output portion provided at at the lower apex of said main horn unit for providing ultrasonic vibrations to said object to be bonded;

wherein, when ultrasonic vibrations are input to said vibration input portion in a direction generally toward said vibration output portion, ultrasonic vibrations generally perpendicular to the symmetry axis of said main horn unit are output from said vibration output portion; and wherein said main horn unit has a general inverted triangle shape.

2. An ultrasonic horn according to either claim 1, wherein said main horn unit further comprises a load application portion for receiving a downward pressing load applied to said main horn unit, positioned above the lower apex of said horn main unit and near the symmetry axis thereof.

3. An ultrasonic horn according to either claim 1, wherein said main horn unit further comprises a detachable abutting member at said vibration output portion, said abutting member being formed of a wear-resistant material for coming into contact with said object to be bonded.

4. An ultrasonic horn for applying ultrasonic vibrations to an object to be bonded to another object, said ultrasonic horn comprising:

a main horn unit having left and right apexes and a lower apex, formed generally symmetrical horizontally;

a vibration input portion provided at least one of the left and right apexes of said main horn unit; and a vibration output portion provided at the lower apex of said main horn unit for providing ultrasonic vibrations to said object to be bonded;

wherein, when ultrasonic vibrations are input to said vibration input portion in a direction generally toward said vibration output portion, ultrasonic vibrations generally perpendicular to the symmetry axis of said main horn unit are output from said vibration output portion;

wherein said main horn unit further comprises a detachable abutting member at said vibration output portion, said abutting member being formed of a wear-resistant material for coming into contact with said object to be bonded; and wherein said main horn unit is positioned with its axis of symmetry tilted as to the bonding face between said object to be bonded and said object to be bonded to, with the face of contact between said abutting member and said object to be bonded being parallel with said bonding face.

5. An ultrasonic horn according to either claim 1, wherein said main horn unit has an upper side facing said lower apex, with said upper side thereof being formed in a generally symmetrical concave or convex shape.

6. An ultrasonic horn according to either claim 1, wherein the thickness of the center portion of said main horn unit including the lower apex thereof, and the thickness of the ends thereof including the left and right apexes, are not the same.

7. An ultrasonic horn according to either claim 1, wherein a said vibration input portion is provided at each of said left and right apexes on said main horn unit, such that ultrasonic vibrations of a first phase can be input to one vibration input portion and ultrasonic vibrations of the reverse phase to said first phase can be input to the other vibration input portion to produce said ultrasonic vibrations at said vibration output portion.

8. An ultrasonic bonding apparatus for applying a pressing load and ultrasonic vibrations to an object to be bonded to another object, said apparatus comprising:

an ultrasonic horn with a general inverted triangle shape having left and right apexes and a lower apex, formed generally symmetrical horizontally, said horn comprising a vibration input portion provided at at least one of the left and right apexes, a vibration output portion provided at the lower apex, and a load application portion positioned above the lower apex of said horn and near the symmetry axis thereof;

a vibration input device attached to said vibration input portion of said ultrasonic horn, for inputting ultrasonic vibrations to said vibration input portion in generally a direction toward said vibration output portion; and a load applying device linked to said load application portion of said ultrasonic horn, for applying a downwards pressing load to said ultrasonic horn;

wherein said ultrasonic horn is positioned such that said vibration output portion applies a pressing load and ultrasonic vibrations to said object to be bonded; and wherein said load applying device is positioned such that the vector of the pressing load passes over or near said vibration output portion.

9. An ultrasonic bonding method for applying a pressing load and ultrasonic vibrations to an object to be bonded to another object, said method comprising the steps of:

providing an ultrasonic horn with a general inverted triangle shape having left and right apexes and a lower apex, formed generally symmetrical horizontally, said horn comprising a vibration input portion provided at at least one of the left and right apexes, a vibration output portion provided at the lower apex, and a load application portion positioned above the lower apex of said horn and near the symmetry axis thereof;

holding an object to be bonded at the vibration output portion of said ultrasonic horn;

abutting said object to be bonded against an object to be bonded to;

inputting ultrasonic vibrations to said vibration input portion of said ultrasonic horn in generally the direction toward said vibration output portion; and applying a downward pressing load to said load application portion of said ultrasonic horn;

wherein said vibration output portion of said ultrasonic horn applies a pressing load and ultrasonic vibrations to said object to be bonded, thereby bonding said object to be bonded with to said other.

10. An ultrasonic horn for applying ultrasonic vibrations to an object to be bonded to another object, said ultrasonic horn comprising:

a main horn unit with a general inverted triangle shape having left and right apexes and a lower apex;

a vibration input portion provided at least one of the left and right apexes of said main horn unit; and a vibration output portion provided at the lower apex of said main horn unit for providing ultrasonic vibrations to said object to be bonded;

wherein, when ultrasonic vibrations are input to said vibration input portion in a direction which is substantially from said vibration input portion toward said vibration output portion, ultrasonic vibrations generally parallel to a line which connects the left and right apexes of said main horn unit are output from said vibration output portion; and wherein a vibrational node of said ultrasonic vibrations exists in said main horn unit in a position over said vibration output portion.

11. An ultrasonic horn according to claim 4, wherein said main horn unit has a general inverted triangle shape.

* * * * *